United States Patent [19]

Tanaka et al.

[11] Patent Number: 5,047,819
[45] Date of Patent: Sep. 10, 1991

[54] AMORPHOUS-SILICON THIN FILM TRANSISTOR ARRAY SUBSTRATE

[75] Inventors: Sakae Tanaka; Yoshiaki Watanabe, both of Tokyo, Japan

[73] Assignee: Seikosha Co., Ltd., Tokyo, Japan

[21] Appl. No.: 551,688

[22] Filed: Jul. 12, 1990

Related U.S. Application Data

[63] Continuation of Ser. No. 306,372, Feb. 3, 1989, abandoned.

[30] Foreign Application Priority Data

Feb. 26, 1988 [JP] Japan .................................. 63-43576

[51] Int. Cl.5 ..................... H01L 45/00; H01L 27/12; H01L 27/01; H01L 23/48
[52] U.S. Cl. ....................................... 357/23.7; 357/2; 357/4; 357/45; 357/72; 359/59
[58] Field of Search ................... 357/23.7, 2.4, 45, 71; 350/336

[56] References Cited

U.S. PATENT DOCUMENTS

| 4,582,395 | 4/1986 | Morozumi | 357/23.7 |
| 4,705,358 | 11/1987 | Yamazaki et al. | 357/23.7 |
| 4,816,885 | 3/1989 | Yoshida et al. | 357/45 |
| 4,821,092 | 4/1989 | Noguchi | 357/23.7 |
| 4,857,907 | 8/1989 | Koden | 350/336 |

Primary Examiner—J. Carroll
Attorney, Agent, or Firm—Jordan and Hamburg

[57] ABSTRACT

A reverse staggered amorphous silicon thin film transistor array substrate includes an array of amorphous silicon thin film transistors, gate wiring interconnecting the gate electrodes of the amorphous silicon thin film transistors, and source wirings. The transistor array is provided on a thin film transistor array substrate. A protective insulation layer and an amorphous silicon layer having a greater width than the source wiring are provided under the source wiring.

4 Claims, 5 Drawing Sheets

AMORPHOUS-SILICON THIN FILM TRANSISTOR ARRAY SUBSTRATE

This application is a continuation of application Ser. No. 07/306,372 filed Feb. 3, 1988, abandoned.

FIELD OF THE INVENTION

The present invention related to the structure of an amorphous-silicon (hereinafter referred to as "a-Si") thin film transistor (hereinafter referred to as "TFT") array substrate.

BACKGROUND OF THE INVENTION

Active matrix type liquid crystal displays provided with a switching element for each pixel have recently been researched and developed at many institutes for use as thin picture displays, especially for liquid crystal matrix displays. A TFT of the MIS type is generally used as the switching element.

FIG. 4 schematically shows an example of the structure of an active matrix type liquid crystal display which uses a TFT. Reference numeral 21 represents a TFT, and 22 a liquid crystal layer for one pixel which is clamped between a pixel electrode (not shown) connected to the drain electrode of the TFT 21 and a counter electrode 23 provided on a substrate which is on the opposite side of the liquid crystal layer as the substrate provided with the TFT. Reference numeral 2 represents a gate wiring for connecting the gate electrode of each TFT 21 and for supplying a scanning signal which turns each TFT 21 on and off for each line to the gate electrode of the TFT 21. The reference numeral 6 denotes a source wiring for connecting the source electrode of each TFT 21 and supplying a picture signal to the source electrode of each TFT 21 which is selected by the gate wiring 2. The principle of display using an active matrix type liquid crystal display will now be briefly explained with reference to FIG. 4. For example, when a select signal is applied to a signal terminal Xi in the gate wiring 2, all TFTs 21-a which are connected to the terminal Xi are turned on at once, and a picture signal is supplied from the signal terminal Yi, Yi+1, . . . of each source wiring 6 to the pixel electrode which is connected to the drain electrode through the source electrode of each TFT 21-a. The voltage of the pixel electrode and the voltage of the counter electrode 23 determine the voltages applied to the respective liquid crystal layers 22, and the determined voltages change the light transmittances of the respective liquid crystal layers to effect the display. When the signal applied to the signal terminal Xi assumes a nonselected state and each TFT connected to the terminal Xi is turned off, a select signal is applied to the subsequent signal terminal Xi+1, and the above operation is repeated. The voltage applied to each liquid crystal layer 22 is retained due to the capacity component of the liquid crystal layer 22 itself even after the TFT 21 is turned off, until the respective TFT is turned on again.

A reverse staggered type a-Si TFT in which a gate electrode is disposed on the layer under a gate insulation layer and a semiconductor layer and a source electrode and a drain electrode are disposed on the layer above the gate insulation layer and the semiconductor layer is widely utilized as the TFT 21. A reverse staggered a-Si TFT having the structure shown in FIGS. 5 and 6, in which a gate insulation layer, an amorphous silicon layer and a protective insulation layer are subsequently formed in that order, has been proposed from the point of view of reliability and reproducibility.

In FIGS. 5 and 6, reference numeral 1 represents an insulating substrate, 2 a gate wiring, 3 a gate insulation layer, 4 an amorphous silicon layer, 5 a protective insulation layer, 6 a source wiring, 7 a gate electrode, 8 a source electrode, 9 a drain electrode and 10 a pixel electrode.

The number of pixels in an active matrix type liquid crystal display is between several thousand and several hundred thousand, and the number of intersections of the gate wirings and the source wirings is about the same. If even one intersection has a defective insulation such as shorted insulation or defective conduction such as a cut conductor, a line defect occurs on the display screen. This defect is not allowed in a finished product. Therefore, when an a-Si TFT having the structure shown in FIG. 6 is used, an interlayer insulation layer consisting of a gate insulation layer, an amorphous silicon layer and a protective insulation layer, as shown in FIG. 5, is conventionally provided at the intersection of the gate wiring 2 and the source wiring 6. FIG. 7 shows the structure of this portion in which the gate insulation layer 3, the amorphous silicon layer 4 and the protective insulation layer 5 are provided between the gate wiring 2 and the source wiring 6 as the interlayer insulation layer. It has already been proved that such structure is very effective as a measure to counter defective insulation.

In the above-described structure, there is a possibility of producing a disconnection in the source wiring 6 at the end portions of the amorphous silicon layer 4 and the protective insulation layer 5 due to a difference in level. Especially when a commonly used ITO thin film is used for the source wiring 6, since the ITO film formed has a columnar structure, there is a strong probability of producing interstage disconnection or defective conduction at the above-described end portions. If the source wiring 6 is disconnected the picture signal is not effective beyond the position at which the disconnection is produced, resulting in a line defect on the display screen. Such a defect is not allowed in a finished product. Thus, disconnections of the source wiring at the above-described portions great lower the production yield of the products of the prior art.

SUMMARY OF THE INVENTION

Accordingly, it is an object of the present invention to eliminate the above-described problems and to reduce the probability of producing disconnection of a source wiring at the intersection with a gate wiring.

DESCRIPTION OF THE PREFERRED EMBODIMENTS

Figure 1:
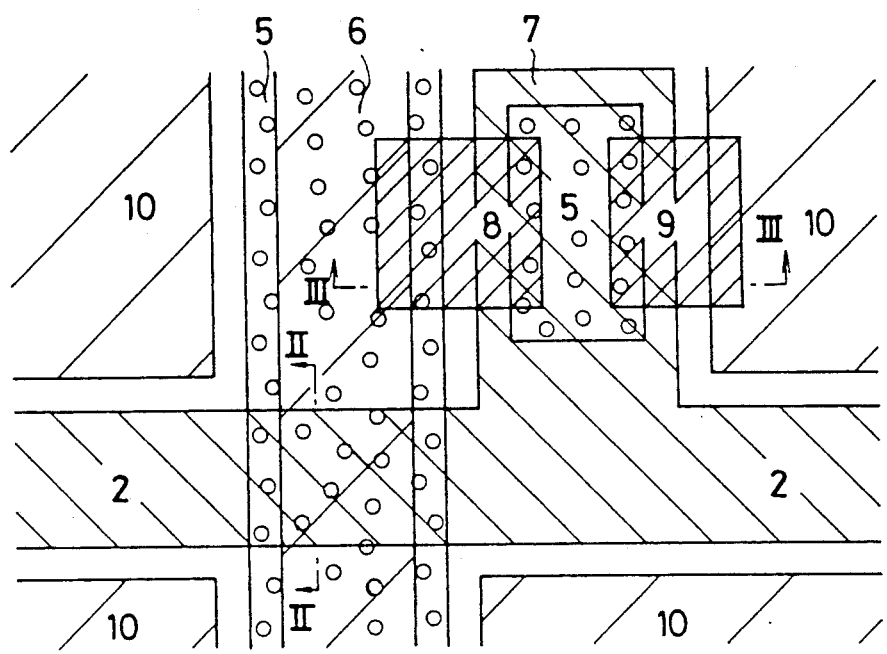
FIG. 1 is a plan view of an embodiment of the present invention.
Figure 2:
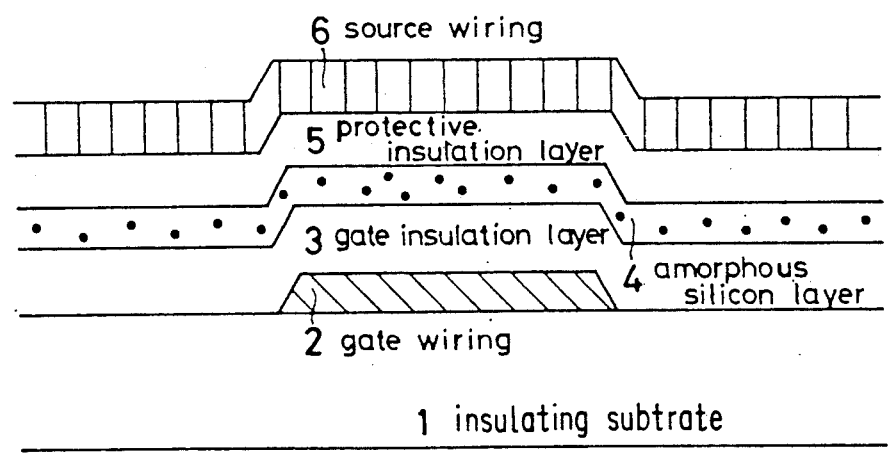
FIG. 2 is a sectional view of the embodiment shown in FIG. 1, taken along the line II—II.

In FIGS. 1 and 2, reference numeral 1 represents an insulating substrate, 2 a gate wiring, 3 a gate insulation layer, 4 an amorphous silicon layer, 5 a protective insulation layer, 6 a source wiring, 7 a gate electrode, 8 a source electrode, 9 a drain electrode and 10 a pixel electrode.

FIGS. 3(a)–3(d) are sectional views of the embodiment shown in FIG. 1, taken along the line III—III, and shown in the order of the manufacturing steps. The elements in FIGS. 3(a)–3(d) correspond to the similar elements shown in FIGS. 1 and 2. The reference numeral 11 represents a silicon layer containing an appropriate amount of n-type impurities (hereinafter referred to as "n-type silicon layer"), and 12 represents a metal layer.

The manufacturing steps for obtaining the above-described structure will be explained hereinafter with reference to FIGS. 1, 2 and 3(a)–3(d).

Figure 3A:
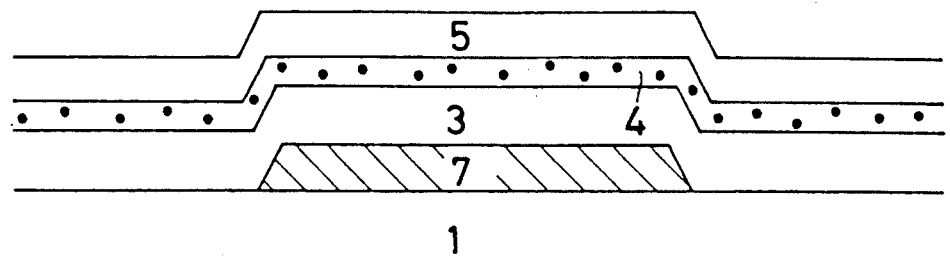
FIGS. 3(a) to 3(d) are sectional views of sequential manufacturing steps for producing the array shown in FIG. 1, taken along the line III—III.

As shown in FIG. 3(a), the insulating substrate 1 is provided with the gate wiring 2 and the gate electrode 7. The gate insulation layer 3 of silicon nitride or silicon oxide, the amorphous silicon layer 4, and the protective insulation layer 5 of silicon nitride or silicon oxide are subsequently deposited on the substrate 1 by plasma CVD.

Figure 3B:
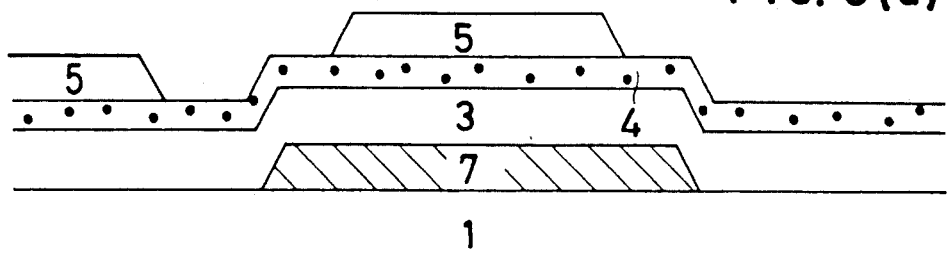
Figure 3C:
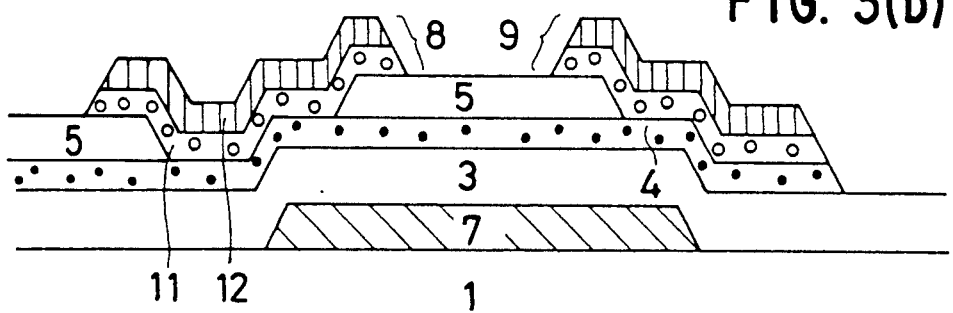
Figure 3D:
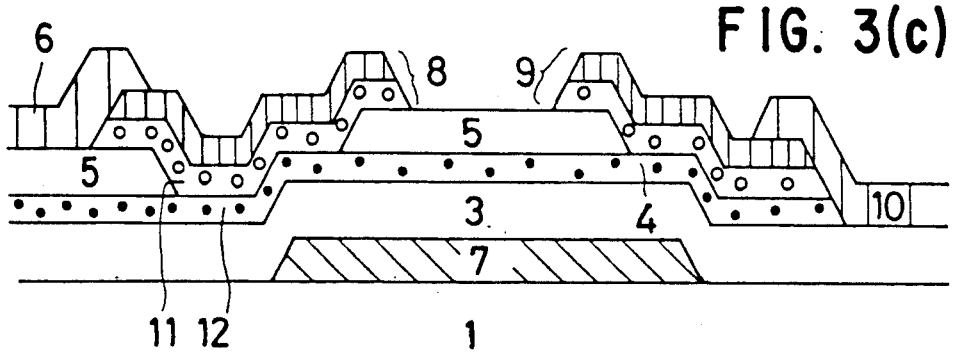
Figure 4:
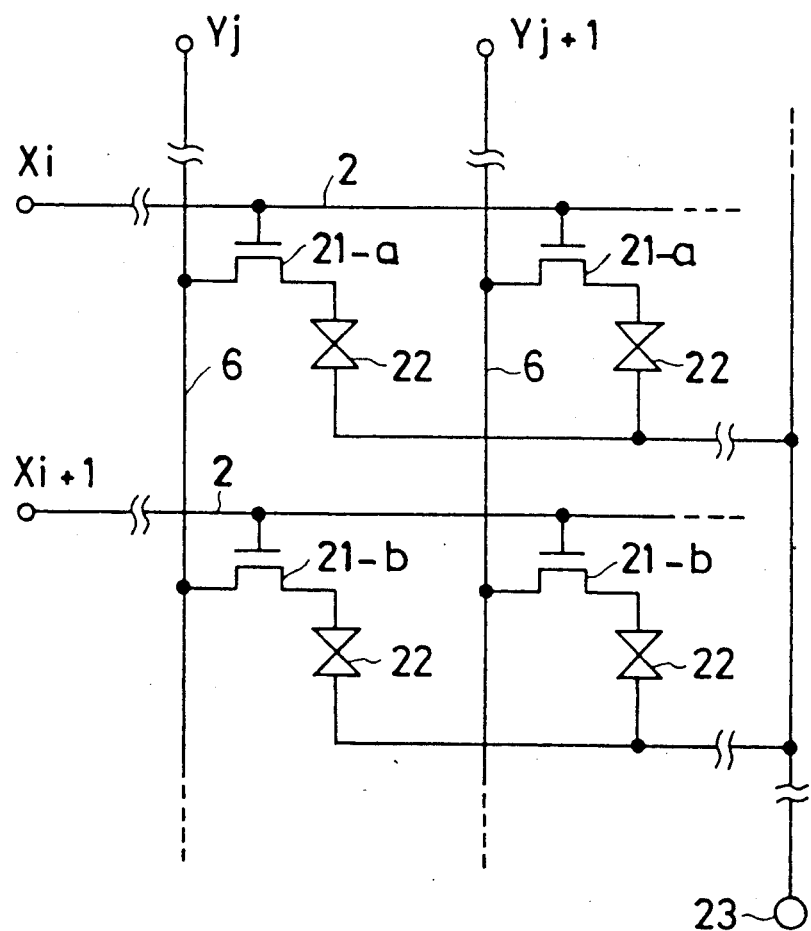
FIG. 4 is an electric circuit diagram showing the circuit wiring of an active matrix type liquid crystal display.
Figure 5:
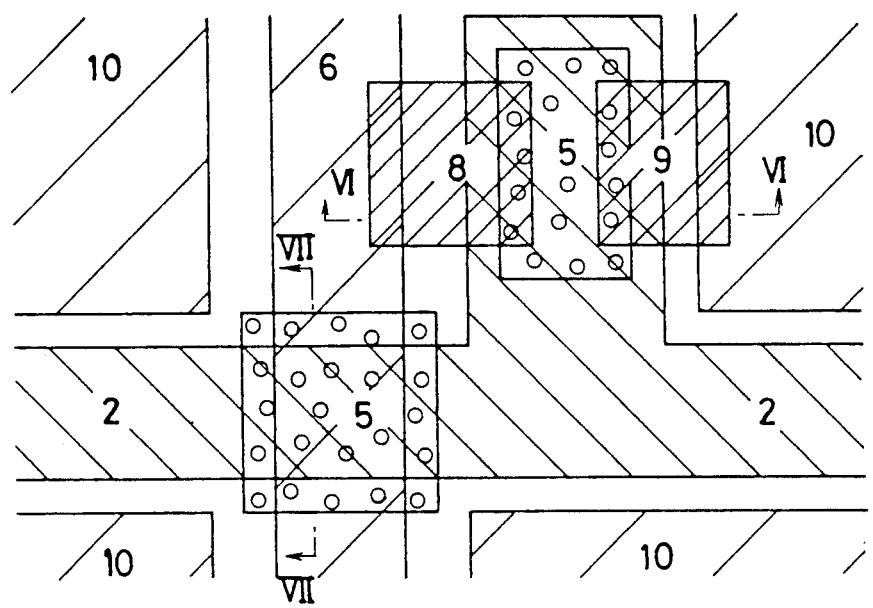
FIG. 5 is a plan view of an example of the prior art.
Figure 6:
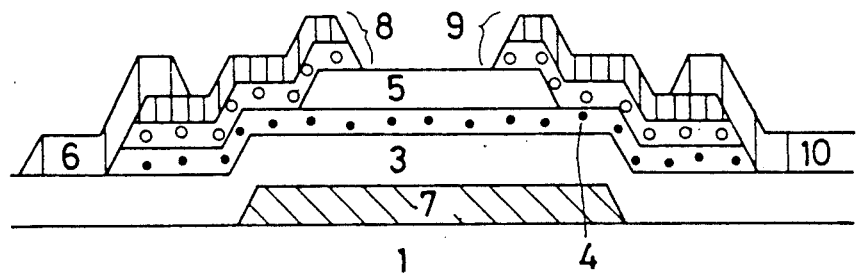
FIG. 6 is a sectional view of the example shown in FIG. 5, taken along the line VI—VI.
Figure 7:
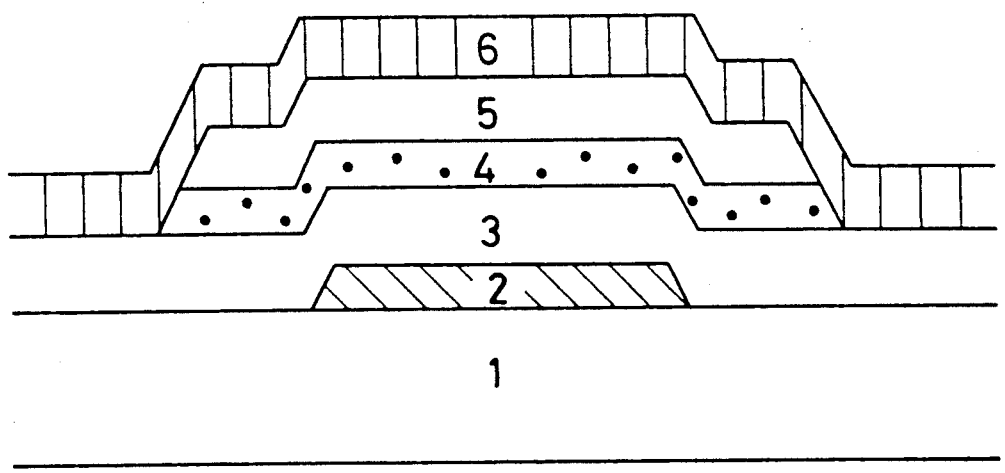
FIG. 7 is a sectional view of the example shown in FIG. 5, taken along the line VII—VII.

As shown in FIG. 3(b), a protective insulation layer 5 is selectively removed by a buffer solution of hydrofluoric acid so as to form an island-like pattern on the gate electrode 7 and to form the protective insulation layer 5 having a larger width than the source wiring over the entire range of the source wiring at the position under the source wiring 6 which is formed at the step in FIG. 3(d).

As illustrated in FIG. 3(c), an n-type silicon layer 11 is deposited by plasma CVD, and subsequently the metal layer 12 is deposited by vacuum deposition or sputtering. The metal layer 12 is provided with the shape of the source electrode 8 and the drain electrode 9 and the n-type silicon layer 11 and the amorphous silicon layer 14 are etched by an organic alkali solution while using the pattern formed by the metal layer 12 and the pattern formed by the protective insulation layer 5 as a mask, thereby forming the source electrode 8 and the drain electrode 9.

Referring to FIG. 3(d), an ITO is vacuum deposited and etched by a ferric chloride solution to form the source wiring 6 and the pixel electrode 10. At this time, it is important to form the source wiring 6 to have a smaller width than the patterns of the protective insulation layer 5 and the amorphous silicon layer 4 etched in the steps of FIGS. 3(b) and 3(c) respectively.

A section of the intersection of the thus-obtained gate wiring 2 and source wiring 6 is shown in FIG. 2. There is no difference in level between the amorphous silicon layer 4 and the protective insulation layer 5, such a difference being inevitable when using the method of the prior art, and the source wiring 6 has only a slight difference in level as produced by the gate wiring 2. This fact has confirmed that the probability of a disconnection occurring at the above-described intersection is clearly reduced as compared with that produced in the prior art.

According to the present invention, since the source wiring does not cross the end portions of the protective insulation layer and the amorphous silicon layer at which there is a difference in level, it is possible to greatly reduce the difference in level of the source wiring, so that the probability of the occurrence of disconnection is greatly reduced. This feature greatly contributes to increases in the production yield.

We claim:

1. In a reverse staggered amorphous silicon thin film transistor array substrate including an array of amorphous silicon thin film transistors having source and gate electrodes, gate wirings connected to the gate electrodes of said amorphous silicon thin film transistors, a gate insulating layer deposited on said gate wirings and gate electrodes, source wirings extending in a given direction, having a given width and arranged to cross said gate wirings to define a plurality of cross overs, an amorphous silicon layer deposited on said gate insulating layer at said cross overs, a protective insulation layer deposited on said amorphous silicon layer at said cross overs and having a greater width than said given width, said source wiring being deposited on said protective insulation layer at said cross overs, said source wirings being connected to the source electrodes of said amorphous silicon thin film transistors at locations spaced from said cross overs, said source wiring being of a different material than said source electrodes, said substrate comprising an amorphous-silicon thin film transistor array substrate, the improvement wherein said amorphous silicon layer is deposited on said gate insulating layer at said locations, said protective insulation layer is deposited on said amorphous silicon layer at said locations, said source electrode is formed on said protective insulation layer at said locations, said source wiring is formed on said source electrode at said locations, whereby said protective insulation layer and amorphous silicon layer extend from said cross overs in the direction of said source wiring at least as far as said source electrodes, whereby level changes in said source wiring adjacent said cross overs are minimized.

2. The amorphous silicon thin film transistor of claim 1 wherein said protective insulation layer extends substantially continuously with said source wiring.

3. In a reverse staggered amorphous silicon thin film transistor array substrate including an array of amorphous silicon thin film transistors having gate electrodes and source electrodes, gate wirings connected to the gate electrodes of said amorphous silicon thin film transistors, a gate insulating layer deposited on said gate wirings and gate electrodes, source wirings extending in a given direction having a given width and arranged to cross said gate wirings to define a plurality of cross overs, an amorphous silicon layer deposited on said gate insulating layer at said cross overs, a protective insulation layer deposited on said amorphous silicon layer at said cross overs and having a greater width than said given width, said source wiring being deposited on said protective insulation layer at said cross overs, said source wirings being connected to the source electrodes of said amorphous silicon thin film transistors at locations spaced from said cross overs, said source wiring being of a different material than said source electrodes, said substrate comprising an amorphous-silicon thin film transistor array substrate, the improvement wherein said amorphous silicon layer is deposited on said gate insulating layer at said locations, said protective insulation layer is deposited on said amorphous silicon layer at said locations, said source electrode is formed on said protective insulation layer at said locations, and said source wiring is formed on said source electrode at said locations, said source wiring having a given level and being deposited primarily solely on said protective insulation layer, said protective insulation layer and amorphous silicon layer extending in the direction of said source wiring a sufficient distance that the level of said source wiring does not change substantially adjacent said transistors.

4. In a reverse staggered amorphous silicon thin film transistor array substrate including an array of amorphous silicon thin film transistors having gate electrodes and source electrodes, gate wirings connected to the gate electrodes of said amorphous silicon thin film transistors, a gate insulating layer deposited on said gate wirings and gate electrodes, source wirings extending in a gate direction having a given width and arranged to cross said gate wirings to define a plurality of cross overs, an amorphous silicon layer deposited on said gate insulating layer at said cross overs, a protective insulation layer deposited on said amorphous silicon layer at said cross overs and having a greater width than said given width, said source wiring being deposited on said protective insulation layer at said cross overs, said source wirings being connected to the source electrodes of said amorphous silicon thin film transistors at locations spaced from said cross overs, said source wiring being of a different material than said source electrodes, said substrate comprising an amorphous silicon thing film transistor array substrate, the improvement wherein said amorphous silicon layer is deposited on said gate insulating layer at said locations, said protective insulation layer is deposited on said amorphous silicon layer at said locations, said source electrode is formed on said protective insulation layer at said locations, and said source wiring is formed on said source electrodes at said locations, whereby said protective insulation layer has at least one stepped edge, said protective insulation layer and amorphous silicon layer extending substantially continuously with said source wiring, said source wiring being formed primarily on said protective insulation layer so as to avoid crossing over the stepped edge of said protective insulation layer.

* * * * *